SEMICONDUCTOR UNIT AND METHOD OF MAKING SAME

Filed May 23, 1955

INVENTOR
Morton E. Jones

BY Stevens, Davis, Miller and Mosher
ATTORNEYS

United States Patent Office 2,845,374
Patented July 29, 1958

2,845,374

SEMICONDUCTOR UNIT AND METHOD OF MAKING SAME

Morton E. Jones, Dallas, Tex., assignor to Texas Instruments Incorporated, Dallas, Tex., a corporation of Delaware Application May 23, 1955, Serial No. 510,422
10 Claims. (Cl. 148—1.5)

This invention relates to electrical junctions in semiconductors, and particularly to those used in crystal diodes and transistors. More especially, this invention relates to a method of making an improved type of electrical semiconductor junction and to the junction so made.

In the presently known methods of making electrical junctions in semiconductors, there is deposited on the surface of a semiconductor a thin film of a conductivity-affecting impurity by vaporizing such an impurity adjacent the surface and in a high vacuum. The conductivity-affecting impurity is then alloyed into the surface by heating, thus changing the conductivity type of the semiconductor material adjacent the surface and forming an electrical junction between that part of the semiconductor material and the remainder of the semiconductor material.

The result of the practice of the invention of the Jackson application is to form an electrical junction between the alloyed portion and the unalloyed portion of the semiconductor material, and this junction is quite thin and quite sharp. As a result, the potential gradient across the junction is often extremely high, and in some cases may easily exceed a million volts per inch.

It is the purpose of this invention to convert electrical semiconductor junctions made in accordance with this application into junctions of somewhat greater thickness which change more gradually, and thus are able to withstand higher reverse voltages with relatively lower voltage gradients across them. This same improvement in junctions of the type described in the above-mentioned application further provides a method by which field effect transistors may be made and the thickness of material between the gates controlled, and multiple-junction transistors made, and the thickness of the layer between the junctions controlled.

In a broad sense, this invention comprises the making of what may be called a graded junction by vacuum plating a material onto a semiconductor block and by heating the plated block for a prolonged period of time and at a relatively high temperature to cause the atoms of the coating material to actually diffuse into the solid semiconductor material to a depth that materially exceeds the depth to which the coating material would penetrate in a convenional alloying process.

Taking for an example a semiconductor material consisting of n-type silicon, and utilizing as a conductivity-affecting impurity metallic aluminum, a coating varying from about a ten-thousandth to a few thousandths of an inch in thickness may be placed on the silicon by vacuum plating, as described in the Jackson application. To accomplish the diffusion required according to the present invention, the coated silicon semiconductor material is heated for a considerably long period of time, for example, ten to fifty hours, in an inert atmosphere of some gas such as helium, or hydrogen, and at a sufficiently high temperature to cause the required diffusion, for example, about 1000° C. to 1400° C. Higher temperatures and longer period of time cause greater diffusion, and vice versa.

Further details and advantages of this invention will be apparent from the following detailed description of several embodiments thereof, together with the appended drawings illustrative thereof. In the drawings.

Figure 1:
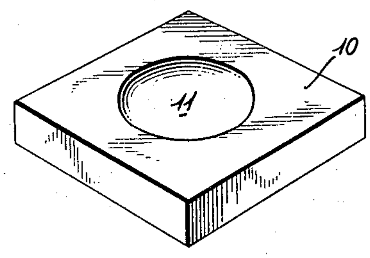
Figure 1 is a view in perspective of a silicon block.
Figure 3:
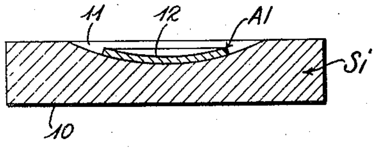
Figure 3 is a view in section similar to Figure 2, showing a coating of aluminum in the crater.
Figure 5:
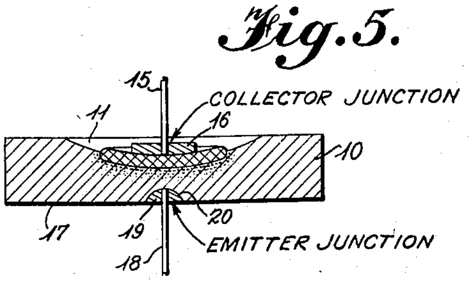
Figure 5 is a view in section illustrating the completed unit.

Referring now to the drawings, there will be described in detail the structure illustrated in Figure 5 and its method of preparation as illustrated in Figures 1 to 5 inclusive. In Figure 1, there is shown a semiconductor block 10, such as silicon, defining in its upper surface 13 a crater or depressed region 11. The silicon block, as illustrated in Figures 1 to 6 inclusive, contains an impurity, such as an n-type impurity, which may be any one or combination of arsenic, bismuth, antimony or phosphorus. The block 10 is placed into a chamber and the atmosphere evacuated therefrom. Thereafter, there is deposited over an area of the crater a layer of p-type material, such as aluminum 12, as illustrated in Figure 3. This is preferably carried out by means of a vacuum plating or vacuum sputtering operation. The block is then heat treated at a temperature of about 1000° C. to 1400° C. and preferably at a temperature of about 1200° C. This heat treatment is carried on in an inert atmosphere, such as a helium, argon or hydrogen atmosphere. The time of the heat treatment and temperature is important, and it is recommended that the treatment should be continued under the conditions above specified for a period of time from about ten hours to about 50 hours. At this high temperature, a diffusion effect results, and portions of the aluminum will actually physically diffuse into the silicon block. This is graphically illustrated in Figure 4. In short, due to the prolonged period of heating at a high temperature, atoms of the aluminum will actually physically diffuse into the solid silicon block to a depth that materially exceeds the depth to which the coating material would penetrate due to alloying alone.

As a consequence, there is formed a graded electrical junction between the alloyed portion of the block, which will be characterized by p-type conductivity, and the remainder of the block, which is characterized by n-type conductivity. The junction thus formed will not be thin or sharp, and thus the potential gradient across the junction will be substantially lower than would be the case in a conventional silicon rectifier characterized by a conventional thin, sharp p-n junction. In addition, the completed unit is capable of withstanding higher reverse voltages with relatively lower voltage gradients across the junction. Due to the graded junction formed as above described, the junction will have a substantially lower capacity. The overall unit, therefore, will have improved high frequency characteristics as a direct result of the lower junction capacity.

Following the above a collector lead 15 is attached to the block by the following technique. The crater 11 is roughened as by sand blasting and a nickel plating 16 is applied to the block 10. Plating 16 in the circumstances of the invention serves as the collector cathode. Lead 15 is soldered or otherwise directly attached to the collector electrode (plating 16). On the opposite face 17 of block 10 there is fixed an emitter lead 18. A small quantity of a p-type material is alloyed into the surface 17 of block 10 to form the hemispherical mass 19. By this procedure, an emitter junction 20 is formed between the p-type conductivity mass 19 and the n-type conductivity block 10. Thereafter, the lead 18 is fixed to the mass 19. This is generally accomplished by placing the block 10 in a helium atmosphere and electrically heating it while pressing the end of lead 18, which may be a 5 mil aluminum wire, against the p-type mass 19. A microscope may be used to advantage for the purpose of observing the block 10 and wire 18 during this operation. The heating is continued until the contacting end of wire 18 softens and alloys itself with the p-type mass 19, whereupon the heating is stopped and the connection allowed to solidify. Finally, connection is made to the block 10 itself (not shown) in substantially the same way as described above. It will be appreciated that the portion of block 10 lying between junction 20 and the graded junction will be in effect the base layer of the unit. According to the above, a semiconductor article results, which will function as a transistor and which will be characterized by a relatively sharp transition junction 20 between the emitter and the block 10, on the one hand, and a gradual graded junction, present between the block 10 and the collector electrode 16.

Whereas the above discussion has been with reference to producing a transistor, it is equally possible to produce a rectifier, using the same techniques. In this case, however, it is necessary to avoid the formation of a junction while making the connection between the block 10 and the lead 18. This can readily be accomplished by using an n-type impurity for the connection rather than a p-type impurity. Accordingly, the lead 18 will be connected to the block 10 through the agency of the n-type impurity, and thus no junction will be formed between the lead 18 and block 10, since the conductivity of both the block 10 and the material used for the connection are the same, namely, n-type.

Although the above remarks have been restricted to the production of silicon diodes and transistors, it will be understood that the present invention applies to all semiconductor materials, and thus includes germanium, as well as others. Whenever p-type material is referred to in the preceding, it is intended to include aluminum, gallium, indium, thallium and boron. Whenever n-type material is referred to in the preceding, it is intended to include bismuth, arsenic, antimony and phosphorus.

In the description of Figures 1 to 5 inclusive, there is formed a transistor of the p–n–p type. It is also possible to employ the techniques of the present invention in the making of an n–p–n type transistor. In this case, in place of coating the crater of the block 10 with aluminum, which is a p-type material, any one or combination of the n-type materials may be employed.

Figure 6:
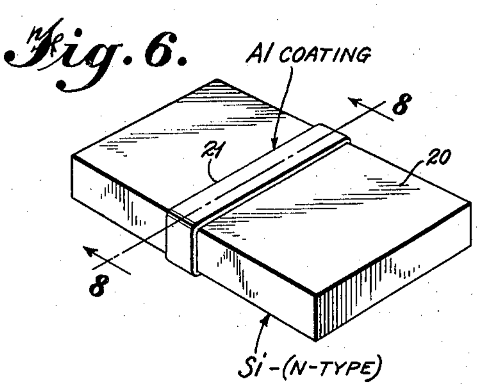
Figure 6 is a view in perspective of a silicon block provided with an aluminum coating.
Figure 2:
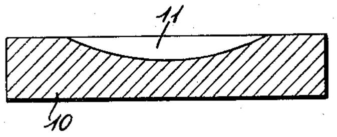
Figure 2 is a view in section through the block illustrated in Figure 1.
Figure 7:
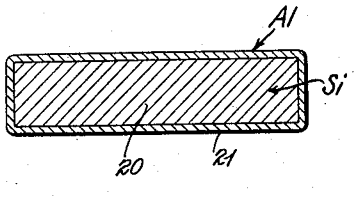
Figure 7 is a view in section of Figure 6 taken along line 7—7.
Figure 8:
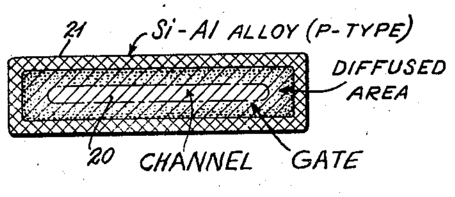
Figure 8 is a view in section similar to Figure 7, illustrating the condition of the block after the diffusion heat treatment.
Figure 4:
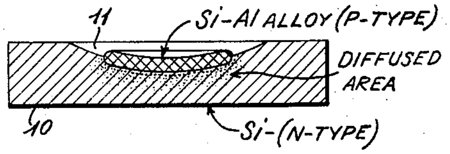
Figure 4 is a view in section illustrating the condition of the block after the diffusion heat treatment.

Referring now to Figures 6 to 8, there is illustrated a method of making a field-effect transistor. As will be evident from Figure 6, a block 20 of semiconductor material has a metallic band 21 coated around its periphery usually but not necessarily equidistant from each end of the block. The block 20 may be either silicon or germanium and may contain either an n-type impurity or a p-type impurity. The band 21, which is coated onto the block, is composed of a metal or material, depending upon the type of impurity which is present in the block 20. If the block 20 contains an n-type impurity, then the band 21 is a p-type material. Likewise, if the block 20 contains a p-type impurity, then the band 21 is of an n-type material. In order to simplify the discussion, it is assumed that the block 20 is silicon containing an n-type impurity and that the material of the band 21 is aluminum. The band 21 is coated onto the block 20 by means of a vacuum plating or a vacuum sputtering operation.

Thereafter, the assembly is placed into a suitable heating apparatus, as, for example, an oven, and subjected to a heat-treating operation in an inert atmosphere, such as helium, hydrogen, etc., for a prolonged period of time. The temperature at which the assembly is heated is from about 1000° C. to about 1400° C. It is preferred, however, that the assembly be heated at a temperature of about 1200° C. The heating operation is carried on for a prolonged period of time, as mentioned above, and this prolonged period of time may extend from about 10 hours to about 50 hours. During this heat-treating of the assembly, atoms of the aluminum in the coating physically diffuse into the block 20 to a degree and in an amount depending upon the temperature at which the assembly is being heated and also the period of time that the heating is continued. As a result of this diffusion action, there will be created in the plane of the belt 21 a diffused, graded p-n junction. As will be evident from Figure 8, the cross-sectional area of the silicon block which will be uncontaminated with aluminum atoms is substantially reduced. This uncontaminated central area is normally designated a channel in a field-effect transistor, and this legend has been applied to it in Figure 10.

Although the present invention has been shown and described with reference to specific embodiments, nevertheless, various changes and modifications such as are obvious to one skilled in this art are deemed to be within the spirit, scope and contemplation of the present invention.

What is claimed is:

1. A transistor device comprising a block of semiconductor material with a melting point greater than 1400° C. and containing an impurity producing therein a conductivity of one type, and a material producing an opposite type conductivity alloyed and diffused into at least one surface of said semiconductor block at a temperature of from 1000° C. to 1400° C. over a period of from 10 to 50 hours whereby a graded p-n junction is produced, said material being diffused to a depth such that a narrow region of said one type conductivity is provided in the path of current flow between input and output connections to said block.

2. A transistor device comprising a block of semiconductor material with a melting point greater than 1400° C. and containing an impurity producing therein a conductivity of one type, a first material producing an opposite type conductivity alloyed and diffused into one surface of said semiconductor block at a temperature of from 1000° C. to 1400° C. over a period of from 10 to 50 hours to form a collector region, a second material producing said opposite type conductivity alloyed into a surface of said semiconductor block opposite from said one surface to form an emitter region, and a narrow base region of said one conductivity type between said emitter and collector regions providing a path for current flow therebetween.

3. A transistor device as defined in claim 2 wherein said material is alloyed and diffused into one surface of said block at a temperature of 1200° C.

4. A transistor device as defined in claim 1 wherein said semiconductor material is silicon.

5. A transistor device as defined in claim 1 wherein said impurity producing a conductivity of one type is an n-type impurity.

6. A transistor device as defined in claim 2 wherein said semiconductor material is silicon.

7. A transistor device as defined in claim 2 wherein said impurity producing a conductivity of one type is an n-type impurity.

8. A field-effect transistor device comprising a block of semiconductor material with a melting point greater than 1400° C. and containing an impurity producing therein a conductivity of one type, a material producing an opposite type conductivity alloyed and diffused into at least one surface of said block at a temperature of from 1000° C. to 1400° C. over a period of from 10 to 50 hours to form a graded junction gate region and a channel of single conductivity type of said one type conductivity between the input and output connections to said block.

9. A field-effect transistor device as claimed in claim 8 wherein said semiconductor material is silicon.

10. A field-effect transistor device as claimed in claim 8 wherein said semiconductor material is an n-type material.

References Cited in the file of this patent

UNITED STATES PATENTS

| | | |
|---|---|---|
| 2,597,028 | Pfann | May 20, 1952 |
| 2,644,852 | Dunlap | July 7, 1953 |
| 2,701,326 | Pfann et al. | Feb. 1, 1955 |

UNITED STATES PATENT OFFICE

CERTIFICATE OF CORRECTION

Patent No. 2,845,374 July 29, 1958

Morton E. Jones

It is hereby certified that error appears in the printed specification of the above numbered patent requiring correction and that the said Letters Patent should read as corrected below.

Column 4, line 25, for "Figure 10" read -- Figure 8 --.

Signed and sealed this 18th day of November 1958.

(SEAL)
Attest:

KARL H. AXLINE
Attesting Officer

ROBERT C. WATSON
Commissioner of Patents